United States Patent [19]

Holmes et al.

[11] Patent Number: 5,550,481

[45] Date of Patent: Aug. 27, 1996

[54] CIRCUIT BOARD TEST FIXTURE APPARATUS WITH CAM ROTATLY MOUNTED IN SLIDABLE CAM BLOCK AND METHOD FOR MAKING

[75] Inventors: Frederick J. Holmes, Bellingham; Frederick F. Holmes, Jr., Franklin, both of Mass.

[73] Assignee: Semco Machine Corporation, Wrentham, Mass.

[21] Appl. No.: 385,639

[22] Filed: Feb. 8, 1995

[51] Int. Cl.$^6$ .................. G01R 15/12; G01R 31/02; H01R 13/629
[52] U.S. Cl. ............................................. 324/754
[58] Field of Search .................. 324/753, 754; 339/75–77; 439/200

[56] References Cited

U.S. PATENT DOCUMENTS

| | | | |
|---|---|---|---|
| 4,405,191 | 9/1983 | Fettig | 339/75 M |
| 5,087,878 | 2/1992 | Belmore, III et al. | 324/72.5 |

*Primary Examiner*—Kenneth A. Wieder
*Assistant Examiner*—Barry C. Bowser
*Attorney, Agent, or Firm*—John A. Haug

[57] ABSTRACT

A test fixture (10) for mounting electrical circuit boards (CB, CB') and placing a plurality of test locations of the circuit board in electrical engagement with respective probe test pins (16) of an array of such pins has a cam mechanism (22) mounted in an integrally formed modular frame (20) of an upper assembly (12). The upper assembly (12) is pivotably mounted on a lower base assembly (14) and latched thereto by a latch assembly (28). A circuit board to be tested is placed over an array of longitudinally depressable pins (16), the upper assembly (28) pivoted to a closed position and latched by latch mechanism (28). Handle (22k) attached to the cam assembly (22) is then rotated causing blocks (22f) to slide in rectilinear track (22e) of slide plate (22c) while translating rotary motion of the cams members (22g) to a vertical motion of a pusher plate (30) attached to the slide plates (22c). The pusher plate (30), maintained in selected angular orientation by shafts (24), engages the circuit board (CB, CB') through pusher pins (30a) forcing downward movement of the circuit board against probe pins (16) depressing the probe pins (16) a selected distance.

17 Claims, 7 Drawing Sheets

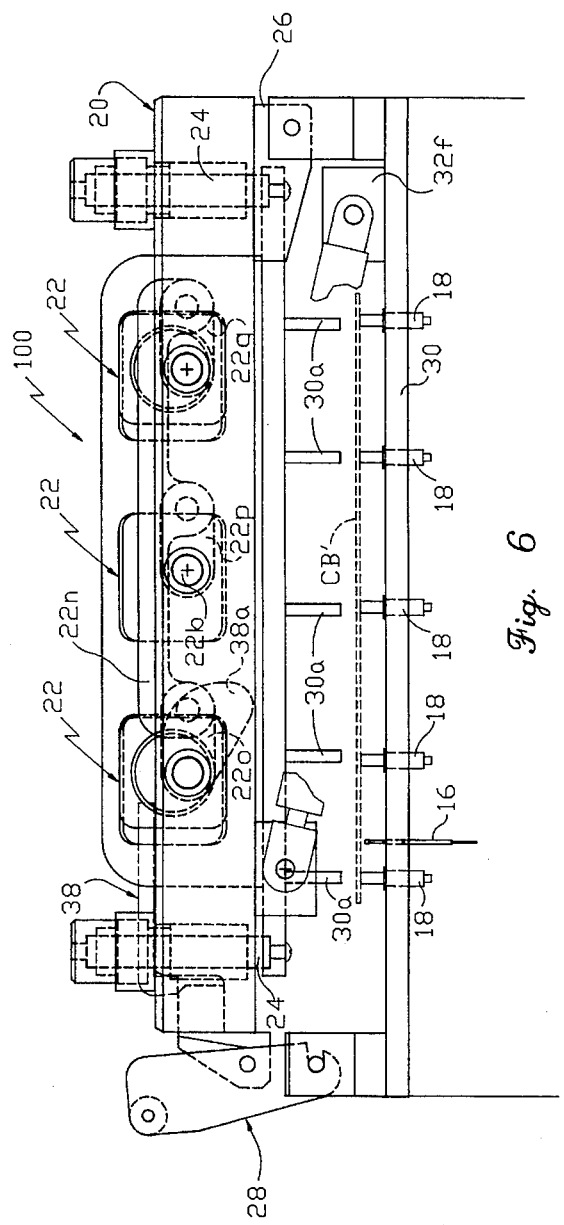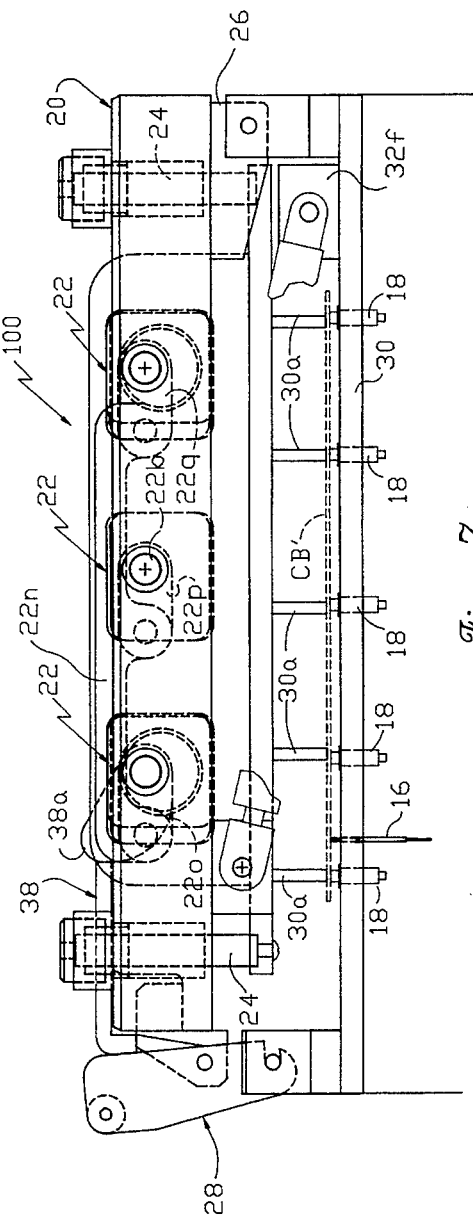

CIRCUIT BOARD TEST FIXTURE APPARATUS WITH CAM ROTABLY MOUNTED IN SLIDABLE CAM BLOCK AND METHOD FOR MAKING

This invention relates generally to the testing of electrical circuits and more particularly to apparatus for mounting a circuit board to be tested for various electrical characteristics and for placing selected locations of the board in electrical engagement with respective electrical probe pins and for a method for making such apparatus.

BACKGROUND OF THE INVENTION

It is known to move a circuit board against an array of longitudinally deformable, spring loaded electrically conductive probe or test pins so that selected test locations of the circuit board are placed in electrically conductive relation with respective test pins in order to perform various tests on the circuit contained on the board. When the circuit board is operatively connected to an output voltage source these pins function to conductively interconnect the test locations on the board to a suitable test circuit connected to the pins and operative to receive and analyze the various electrical test output signals picked up by the pins at the test locations.

For circuit boards having relatively few test locations, e.g., fewer than 100, one cost effective technique which has been used satisfactorily is to invert the circuit board and place the board above the selected array of test pins in a test fixture along with a force transfer member disposed above the circuit board. A cam mechanism disposed above the force transfer member is rotated to apply a downward force on the force transfer member which in turn moves the circuit board into engagement with the test pins deforming the pins in a longitudinal direction a selected amount in order to ensure that a satisfactory electrical connection between the test locations and the test pins has been obtained.

However, as circuit boards have become more dense requiring a greater number of test locations such fixtures have suffered from certain limitations which have adversely affected the functional performance of the test fixture. In this regard it should be noted that each test probe generally requires somewhere between 3.5 and 10.0 ounces to depress it for a selected stroke of approximately 0.166 inch so that as the test locations increase to several hundred and even higher, the force required to place the circuit board in the final test position is greatly increased. As the force required to depress the circuit board increases the difficulty involved in limiting the downward motion to a perpendicular direction and at the same time maintaining the circuit board in a plane perpendicular to the longitudinal axis of the test pins also increases. That is, initially the force transfer member lies in a plane which is perpendicular to the vertical downward direction in which it is desired to move the circuit board. As the cam is rotated to apply the downward force on the force transfer member the point of engagement moves laterally on the surface of the force transfer member thereby imparting a lateral component to the force transfer member causing a tendency to tilt the force transfer member and concomitantly the circuit board out of the perpendicular plane, i.e., the board tilting in skewed movement, with a result that the test pins at certain locations are stroked more than intended while test pins at other locations are stroked less than intended or even not stroked at all. This problem is exacerbated with the so-called "no clean" systems in which higher force pins are used to obviate the need for flux cleaners and the like for environmentally friendly systems. Undesirable, uneven motion also is more likely with pin arrays which are not symmetrical relative to the geographical area of the circuit board.

Motion of the circuit board while engaging the test pins must be restricted to a rectilinear direction parallel with the longitudinal axis of the test pins in order to ensure proper registration of the test locations with respective test pins and for application of the pin depressing force along the longitudinal axes of the pins. That is, a lateral component of force exerted on the test pins imparted by skewed movement of the circuit board can not be tolerated, especially for circuit boards having dense, i.e., closely spaced arrays of test location points.

SUMMARY OF THE INVENTION

It is an object of the present invention to provide a novel apparatus and method for applying improved, accurate, perpendicular movement to a member throughout a precise stroke. Another object is the provision of a circuit board test fixture having an improved cam mechanism adapted to maintain a circuit board in a plane which is perpendicular to the longitudinal axes of an array of test pins and to move the circuit board so that a plurality of test locations of the circuit board will engage respective selected test pins of the array and transfer motion to stroke the pins for a given, uniform distance. Yet another object of the invention is the provision of such a test fixture which is inexpensive yet reliable and having improved useful life. Another object is the provision of a mechanical test fixture which is useful with a greater test pin population than prior art systems.

Briefly, in accordance with the invention, an upper assembly comprises at least one or, if desired, a plurality of spaced, aligned cam slide plates fixedly attached to a motion transfer member in the form of a pusher plate. Each cam slide plate has an opening therethrough forming a rectilinear track. A cam block having a circular bore therethrough is slidingly disposed in each respective track with a circular cam member in turn rotatably received in each respective circular bore. The cam members are eccentrically and fixedly mounted on a cam shaft which in turn is mounted on a frame adapted to be pivoted toward and away from a lower assembly having a base member in which a selected array of test pins is disposed, e.g., in bores formed in a probe plate. A lever attached to the cam shaft is used to turn the cam members causing the cam blocks to slide within the rectilinear track as the rotary motion of the cam members is translated into vertical motion of the pusher plate. The pusher plate is attached to an end of spaced shafts mounted for longitudinal, vertical movement in bores formed in the frame about its outer periphery, e.g., at each corner of a rectangular pusher plate. Preferably, a suitable low friction linear bearing is placed in each shaft receiving bore with a coil spring disposed between the frame or linear bearings and the opposite ends of the shafts by means of a spring cap. The springs, which are compressed as the pusher plate is forced downwardly upon actuation of the cam mechanism, serve to evenly distribute the actuating force on the pusher plate as well as to provide at least a portion of a return force for bringing the cam mechanism back to its unactuated position. According to a feature of the invention the spring caps provide a positive stop which engage a stop surface of the top of the frame at the bottom of the downward stroke to ensure that the pusher plate lies in a plane parallel with a plane passing through the stop surface of the frame. According to another feature of the invention the frame has a window therein defined by integral front, rear and opposite side portions made of strong, rigid material with the portions having sufficient cross sectional area to provide a rigid modular frame so that the location and orientation of the bores for the vertically movable shafts and for the horizontally mounted cam shaft can be precisely controlled relative to one another.

A latch member is pivotably mounted on the frame and adapted to engage with latch pins mounted on the base member when the upper assembly is pivoted from an open position away from the lower base assembly to a closed position adjacent the base assembly. A latch lock is optionally provided which moves into locking position contiguous with the latch member preventing opening movement of the latch member when the cam assembly is actuated.

In a modified embodiment useful for large circuit boards, a plurality of up to three cam mechanisms are interconnected through a link member connected to a driving intermediate link and a motion transfer intermediate link member for each other cam mechanism mounted for movement with the cam shaft.

These and other objects, features and advantages of the present invention will become apparent from the following detailed description of the invention.

BRIEF DESCRIPTION OF THE DRAWINGS

In the accompanying drawings in which several of the various possible preferred embodiments of the invention are illustrated.

FIGS. 6 and 7 are side elevational views similar to FIGS. 2 and 3 of a modified embodiment of the circuit board test fixture shown in the closed, non-actuated position and in the closed, actuated position, respectively.

Corresponding reference characters indicate corresponding parts throughout the several views of the drawings.

DETAILED DESCRIPTION OF PREFERRED EMBODIMENTS

Figure 1:
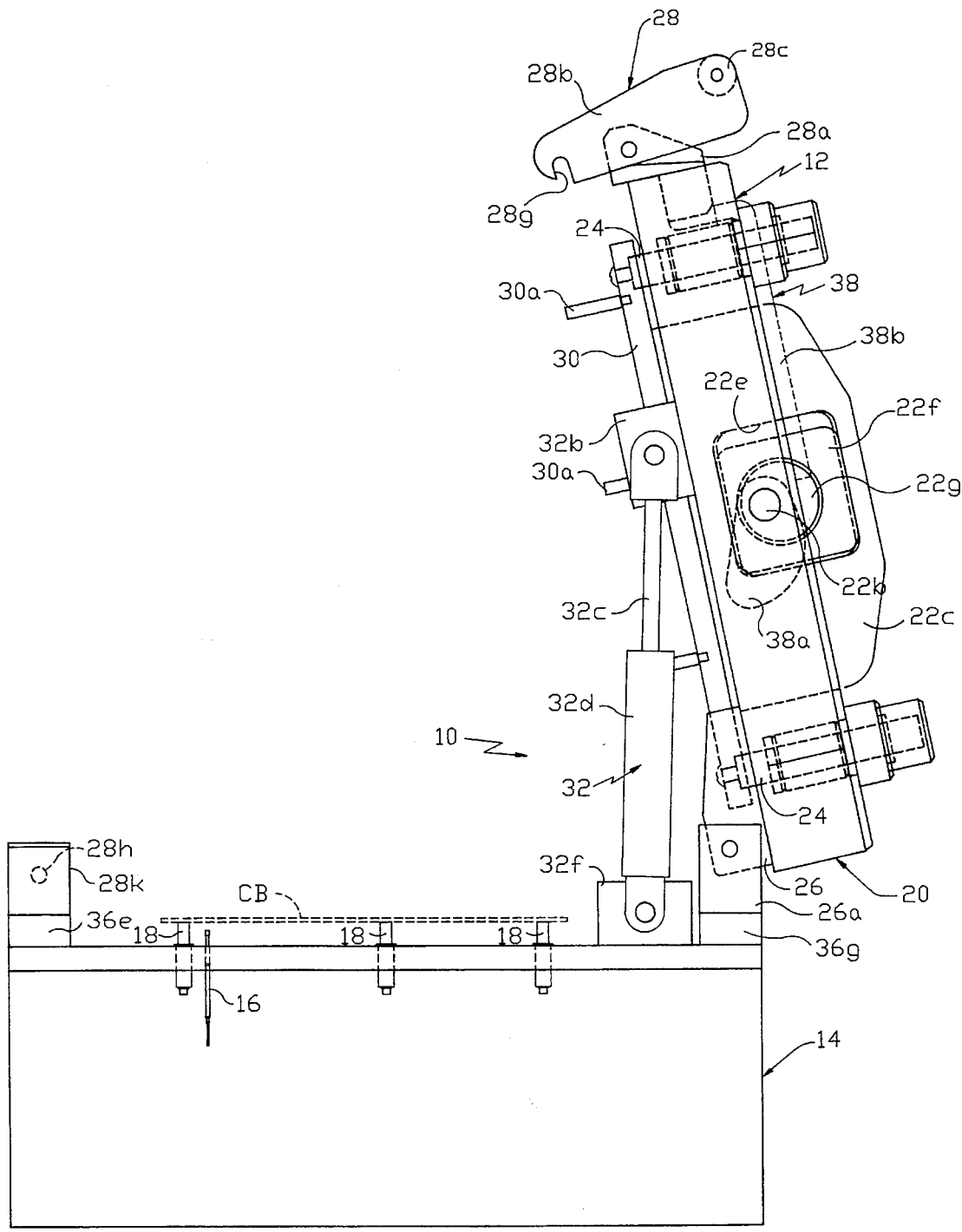
FIG. 1 is a side elevational view of a circuit board test fixture made in accordance with a first embodiment of the invention shown in the open position and with a circuit board to be tested shown in dashed lines.
Figure 2:
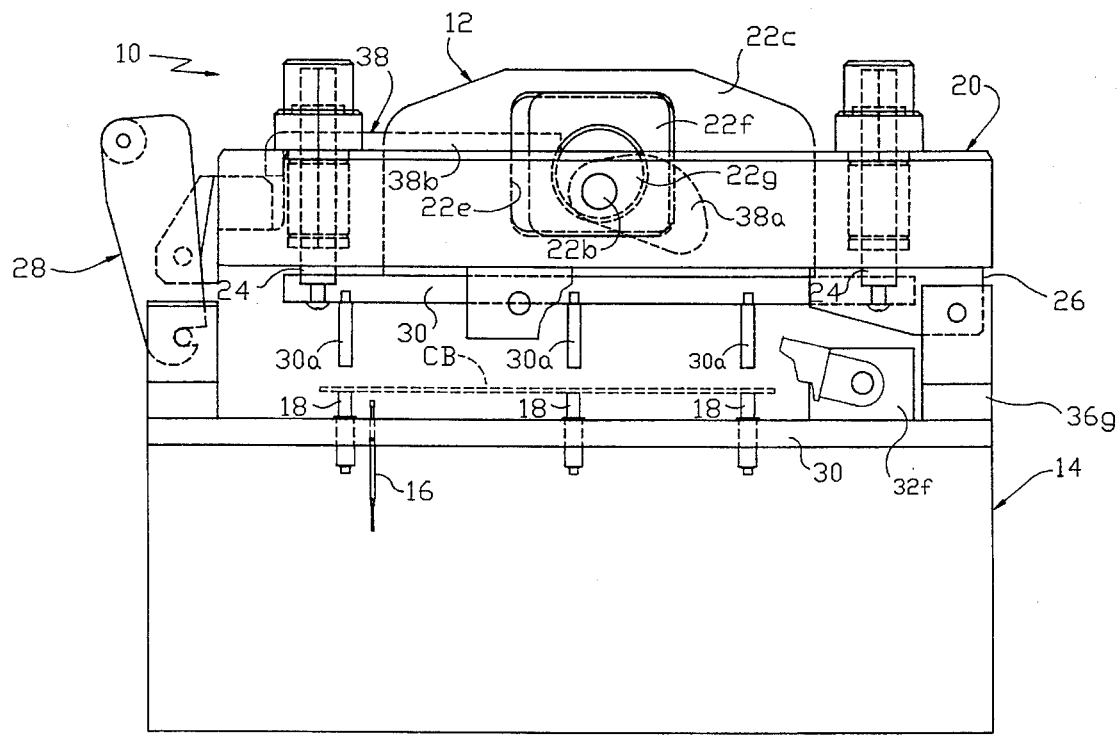
FIGS. 2 and 3 are similar to FIG. 1 but are shown in the closed, non-actuated position and in the closed, actuated position respectively.
Figure 3:
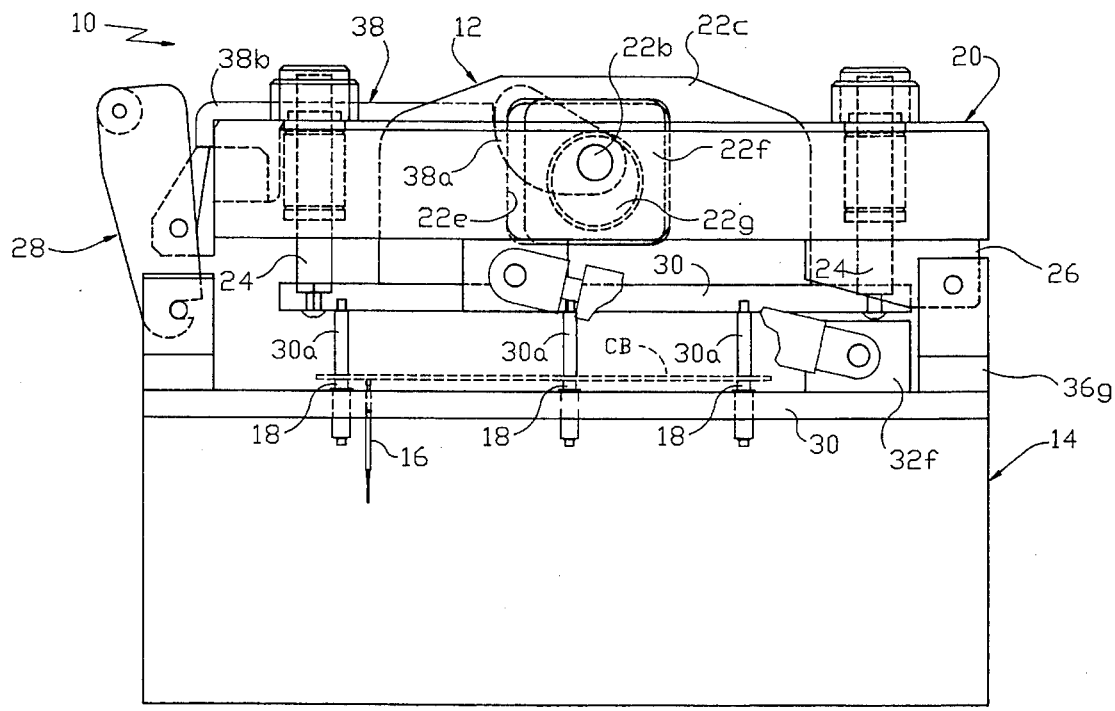

Referring first to FIGS. 1-3, a circuit board test fixture made in accordance with a first embodiment of the invention is designated by numeral 10 and comprises an upper, movable assembly 12 and a lower, stationary assembly 14. In the FIG. 1 position a circuit board CB shown in dashed lines is placed on lower assembly 14, The upper assembly 12 is then pivoted downwardly and latched in the closed position shown in FIG. 2 with circuit board CB maintained above test probe pins 16 (one pin shown for purposes of illustration) by spring biased stand-off pins 18 and then the circuit board CB is moved downwardly a selected distance against the bias of stand-off pins 18 and test probe pins 16 to stroke the pins and make effective electrical engagement therewith. After testing has been completed the circuit board is removed using the same motions in the reverse order.

Figure 4:
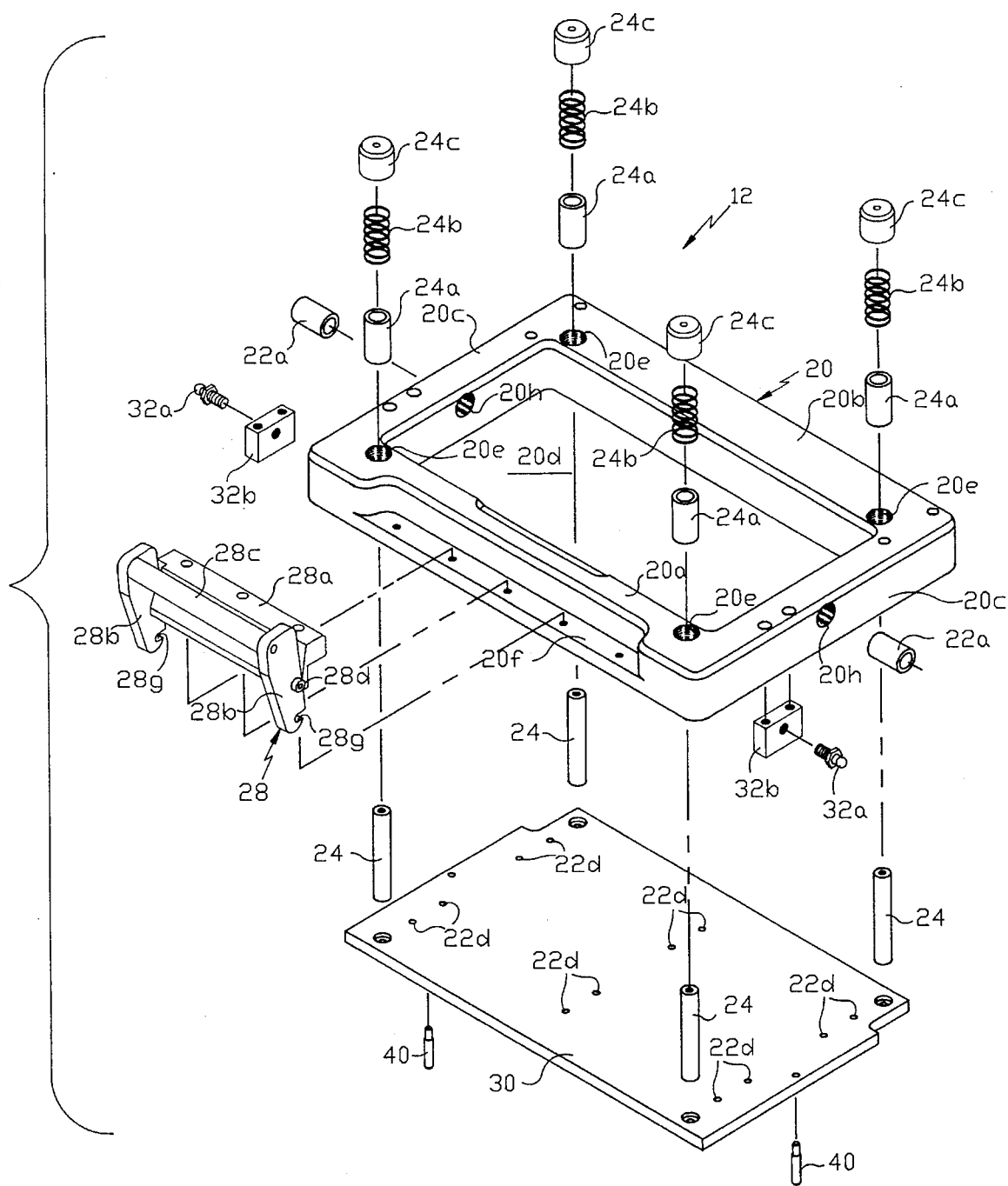
FIG. 4 is a blown-apart perspective view of a portion of the upper, movable assembly of the FIGS. 1-3 test fixture.
Figure 4A:
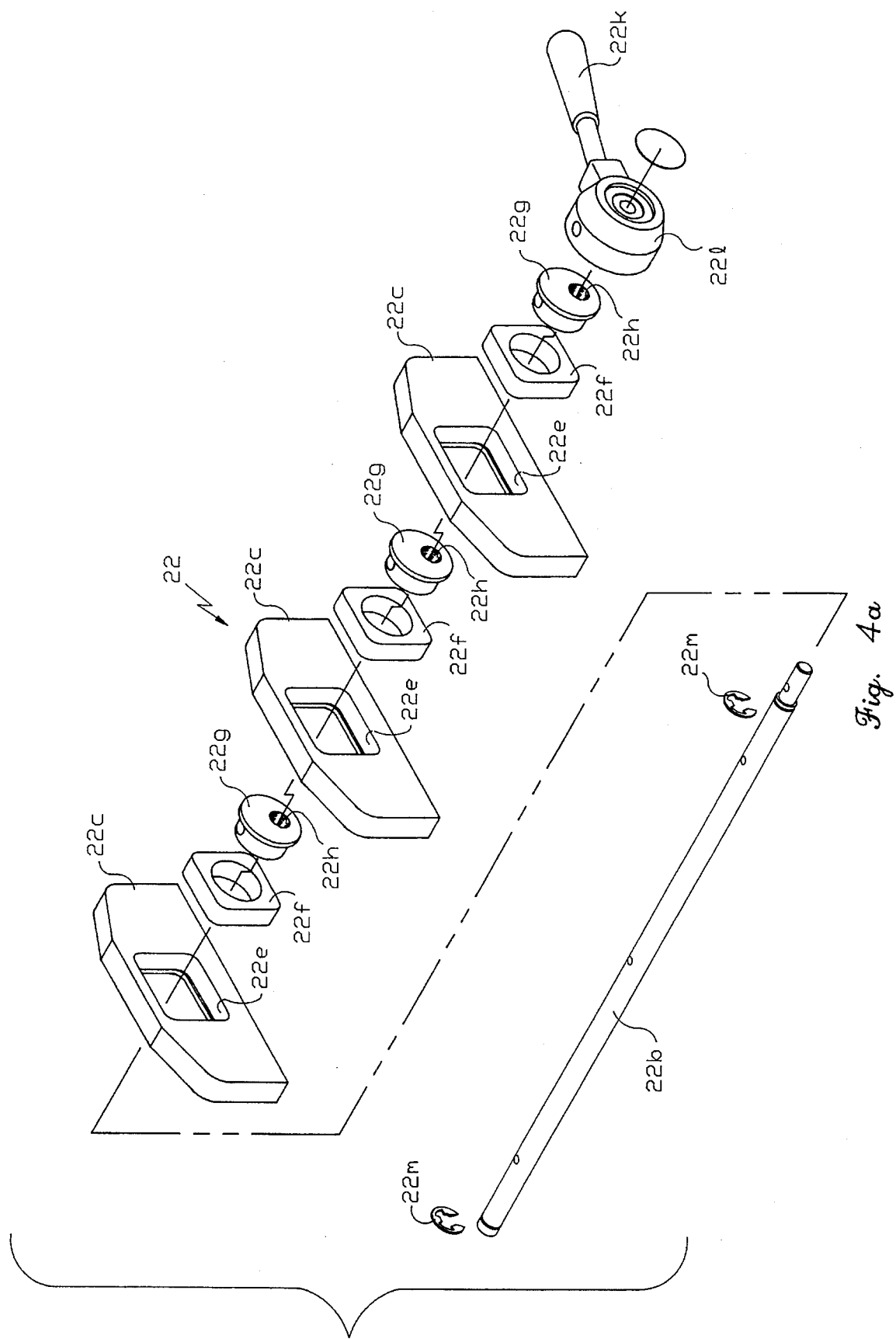
FIG. 4a is a blown-apart perspective view of a cam mechanism which forms a portion of the upper assembly.

With particular reference to FIGS. 4 and 4a, the upper assembly 12 comprises a modular frame formed of front and rear portions 20a, 20b respectively and opposite side portions 20c defining a window 20d. Frame 20 is made of polyvinylchloride, aluminum or other dimensionally stable, strong material, preferably machinable and preferably integrally formed of a single piece of rigid material to provide a stable mount for a cam shaft 22 to be discussed below and to precisely orient bores 20e for reception of a plurality of longitudinally movable shafts 24. Precise location and orientation of bores 20e is critical regarding parallelism with one another and perpendicularity relative to the longitudinal axis of the cam shaft. Shafts 24 are connected at one end to a pusher plate 30 movably mounted relative to the frame. The frame also mounts pivot arms 26 (FIG. 5) on rear portion 20b and latch mechanism 28 on front portion 20a.

Bushings 24a formed of suitable material, such as acetal, are received in bores 20e of frame 20 and serve as linear bearings for shafts 24. It will be understood that any suitable, low friction, accurate linear bearing can be used for shafts 24. Coil springs 24b are preferably used to balance forces on pusher plate 30 and are seated in respective bores 20e on top of bushings 24a and captured there by means of a suitable threaded fastener, not shown. A plurality of pusher pins 30a may be mounted on pusher plate 30 depending downwardly therefrom for a purpose to be described below. Spring caps 24c are adapted to engage frame 20 when in the FIG. 3 actuated position thereby ensuring that pusher plate 30 is bottomed out lying in a plane perpendicular to the longitudinal axes of shafts 24. Shafts 24 are formed of suitable material resistant to gauling and the like, such as a case hardened steel. The bottom portion of shafts 24, as seen in FIG. 4, are attached to pusher plate 30 by suitable fasteners, not shown. Pusher plate 30 is preferably formed of suitable transparent material, such as polycarbonate, to enable observation of the circuit board being tested.

Latch mechanism 28 comprises a base portion 28a which is received on a shoulder 20f formed on front portion 20a of frame 20 and a pair of hook arms 28b interconnected by bar 28c and pivotably mounted to base portion 28a at 28d. Hook arms 28b are biased in a counterclockwise direction as seen in the figures by suitable spring means (not shown) positioned between base portion 28a and the hook arms. Latch notch 28g is adapted to be engaged by a latch pin mounted on lower assembly 14 to be discussed below.

Gas arm assembly 32, shown in FIG. 1, is coupled to frame 20 through ball elements 32a received in respective blocks 32b which in turn are attached to portions 20c of frame 20 using conventional fasteners, not shown.

Bores 20h are formed through side portions 20c of frame 20 with their longitudinal axes coaxial and perpendicular to the longitudinal axes of bores 20e. Bushings 22a of Delrin or other suitable bearing material are received in bores 20h and serve to mount cam shaft 22b of cam assembly 22 shown in FIG. 4a.

Cam assembly 22 comprises, in addition to cam shaft 22b, at least one cam slide plate 22c, and preferably a plurality of such plates, mounted on pusher plate 30 aligned with and spaced from one another, as by securing the plates by conventional fasteners (not shown) through bores 22d shown in FIG. 4. Each plate 22c is formed with a generally rectangular window 22e through opposed side walls having top and bottom surfaces which serve as a track allowing cam block 22f to slide within window 22e along a rectilinear path. Cam blocks 22f are each formed with a circular bore extending through the side walls of the block adapted to receive a respective circular cam member 22g. Cam members 22g, in turn, have eccentrically disposed bores 22h which receive cam shaft 22b and are fixedly attached thereto by suitable means such as set screws (not shown). A lever handle 22k is attached to end collar 22l also fixedly attached to cam shaft 22b. A suitable retainer ring 22m is received in an annular groove at each end of cam shaft 22b to lock the assembly in place. Although three cam slide plates are shown it is within the purview of the invention to employ only a pair in test fixtures having a relatively short width.

Lower assembly 14 comprises a base 34 on which probe plate 36, normally stationary, is pivotably mounted, utilizing hinges 36a, to provide access to the interior of the base for purposes to be discussed below. Probe plate 36 is used to mount an array of spring biased test probe pins 16 having a selected pattern for a given circuit board to be tested. The test probe pins are not shown in FIG. 5 however a single test probe pin is shown in FIGS. 1–3 for purpose of illustration. Base 34 is used to house wiring, power supplies, fans, relays and other associated system components of the test apparatus. Probe plate 36 can be pivoted away from the base to allow access to the interior of the base, as mentioned above, and to facilitate such access supplementary spring biased hinge mechanisms 36b are mounted on the side walls of base 34 through spacer blocks 36c and attached to the probe plate. The spring mechanisms serve to maintain the probe plate in the raised position. A latch plate 36d is mounted on the front portion of probe plate 36 which cooperates with a spring biased latch pin 36e mounted on base member 34 which is receivable in an aperture of the latch plate when the probe board is lowered to the base member to lock it in place. Handles 34a are attached to to opposite sides of base member 34 in a conventional manner.

Gas arm assemblies 32 comprise gas arms 32c and cylinders 32d with arms 32c connected to ball elements 32a of the upper assembly shown in FIG. 4 and with cylinders 32d connected to ball element 32e mounted on gas arm blocks 32f mounted on probe plate 36. The gas arm assemblies 32 bias the upper assembly 12 into the FIG. 1 position when the assembly is not latched in the closed position to be discussed below.

Upper assembly 12, as mentioned above, is pivotably mounted to the lower assembly by means of pivot arms 26 which are fastened to frame 20 and pivotally attached to respective pivot blocks 26a through pivot pins 26b. Pivot blocks 26a, in turn, are attached to probe plate 36 using conventional fasteners (not shown).

Latch assembly 28, shown in FIG. 4, cooperates with laterally extending latch pins 28h (FIG. 5) which are adapted to be received in latching engagement in notches 28g of latch arms 28b. Pins 28h are mounted in latch pin blocks 28k attached to the front portions of probe plate 36 using conventional fasteners (not shown).

In order to accommodate various different circuit boards having different height requirements, sets of optional spacer blocks 36e, 36f and 36g having selected heights can be used to adjust the vertical position of the components of the upper assembly relative to the probe plate as required.

Referring now to FIGS. 1–3, after a circuit board to be tested is placed on stand-off pins 18, the upper assembly 12 is pivoted downwardly against the bias of gas arms 32 and latch 28 is pivoted clockwise permitting latch pins 28h to be received in latch notches 28g as seen in FIG. 2 with pusher pins 30a spaced above circuit board CB. Handle 22k (FIG. 4a) is then rotated counterclockwise and with it cam shaft 22b causing cam members 22g to rotate and push cam blocks 22f sliding the blocks in the track toward the left as seen in the Figures with rectilinear motion for the first portion of the stroke and causing cam slide plates 22c to move downwardly. Continued rotation of the cam members 22g beyond 90 degrees causes the cam blocks to slide back toward the right with cam slide plates 22c continuing downwardly moving pusher plate 30 and pusher pins 30a into engagement with circuit board CB and forcing the circuit board against the probe pins 16 causing them to stroke downwardly a selected distance, e.g., 0.166 inch to ensure good electrical engagement. The provision of cam blocks 22f sliding within track 22e results in separating any lateral component of force from the vertical, downward force applied on pusher plate 30 to thereby provide improved vertical movement of pusher plate 30 and maintaining the plate in a plane perpendicular to the axes of shafts 24.

The right end surface of tracks 22e, as seen in the drawings, serve as a stop surface limiting movement of cam block 22f. Continued rotation of cam shaft 22b in the counterclockwise direction from the position shown in FIG. 3, that is beyond the lowest position of slide plates 22c until the cam blocks 22f engage the right end surface of tracks 22e results in a slight reduction in force with concomitant negligable upward motion of pusher plate 30 to effectively lock the pusher plate in the actuated position with the cam member over center by a slight amount, e.g., one or two degrees. In this position the various electrical tests of the circuit board can be conducted.

In order to prevent unlatching of the upper assembly when the cam mechanism is in the FIG. 3 position a locking mechanism 38 may be employed comprising a suplementary cam member 38a which forces cam lever 38b into engagement with latch arm 28b preventing opening clockwise rotation of the latch arm 28b. A return spring (not shown) moves cam lever 38b away from latch arm 28b when cam member 38a is moved to the FIG. 2 position.

Spring retainer caps 24c have a vertical height selected, relative to the length of alignment shafts 24, so that in the FIG. 3 position the caps bottom out against a stop surface of frame 20 thereby ensuring that the face surface of pusher plate 30 lies in a plane parallel with a plane in which the stop surface of frame 20 lies and perpendicular to the longitudinal axes of alignment shafts 24.

Figure 5:
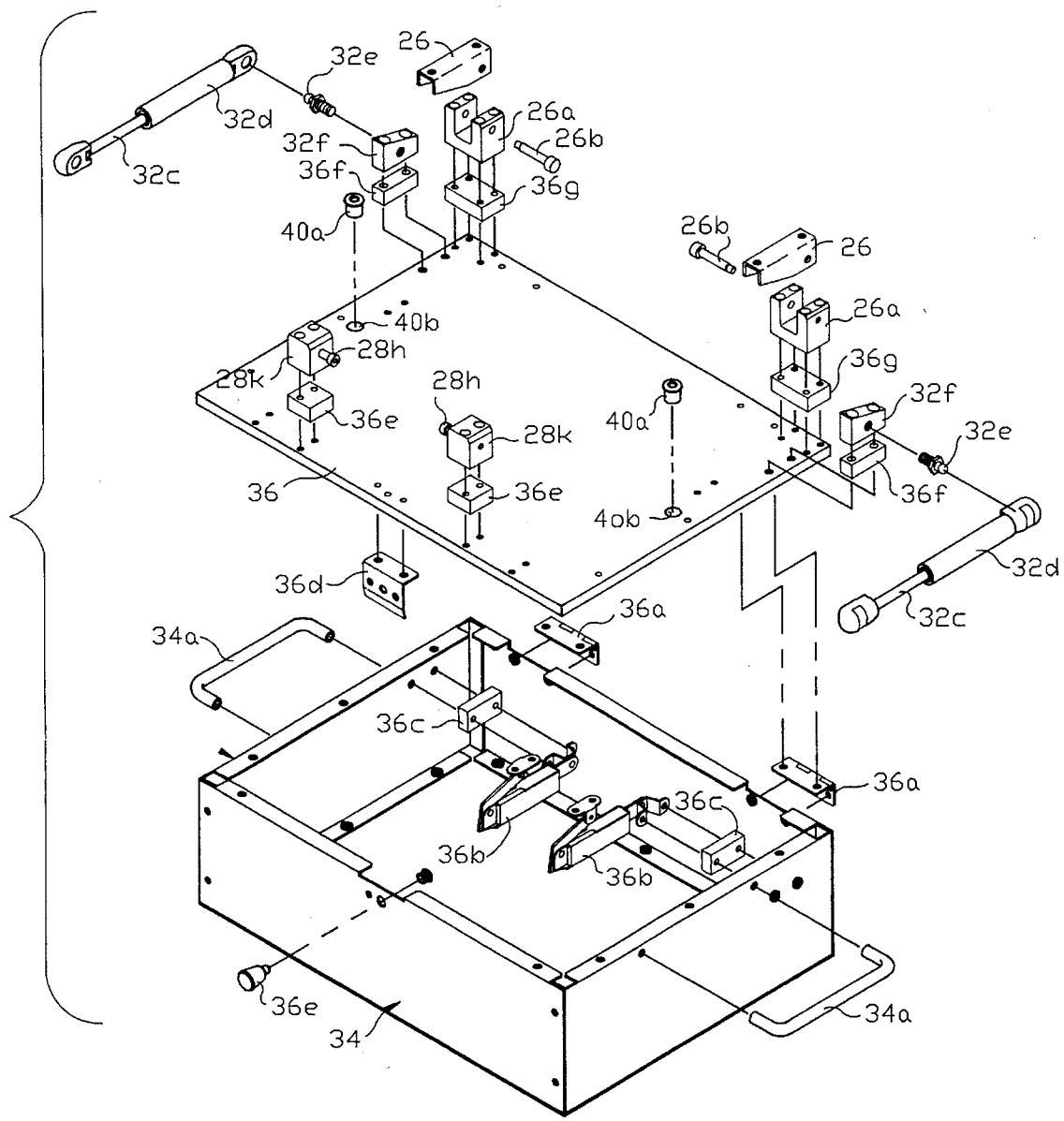
FIG. 5 is a blown-apart perspective view of the lower, stationary assembly of the FIGS. 1-3 test fixture.

If desired, supplementary alignment pins 40, FIG. 4, can be mounted in pusher plate 30 to cooperate with alignment sleeves 40a, FIG. 5, disposed in bores 40b of probe plate 36. However, even without alignment pins 40 the angular orientation of pusher plate 36 can be maintained very precisely in view of the provision of the integrally formed modular frame 20 in which bores 20e can be precisely machined to within a small tolerance, e.g., +/−0.002 inch relative to the location of each bore as well as 0.5 degrees relative to perpendicularity with a selected surface, e.g., the stop surface of frame 20.

Figure 8:
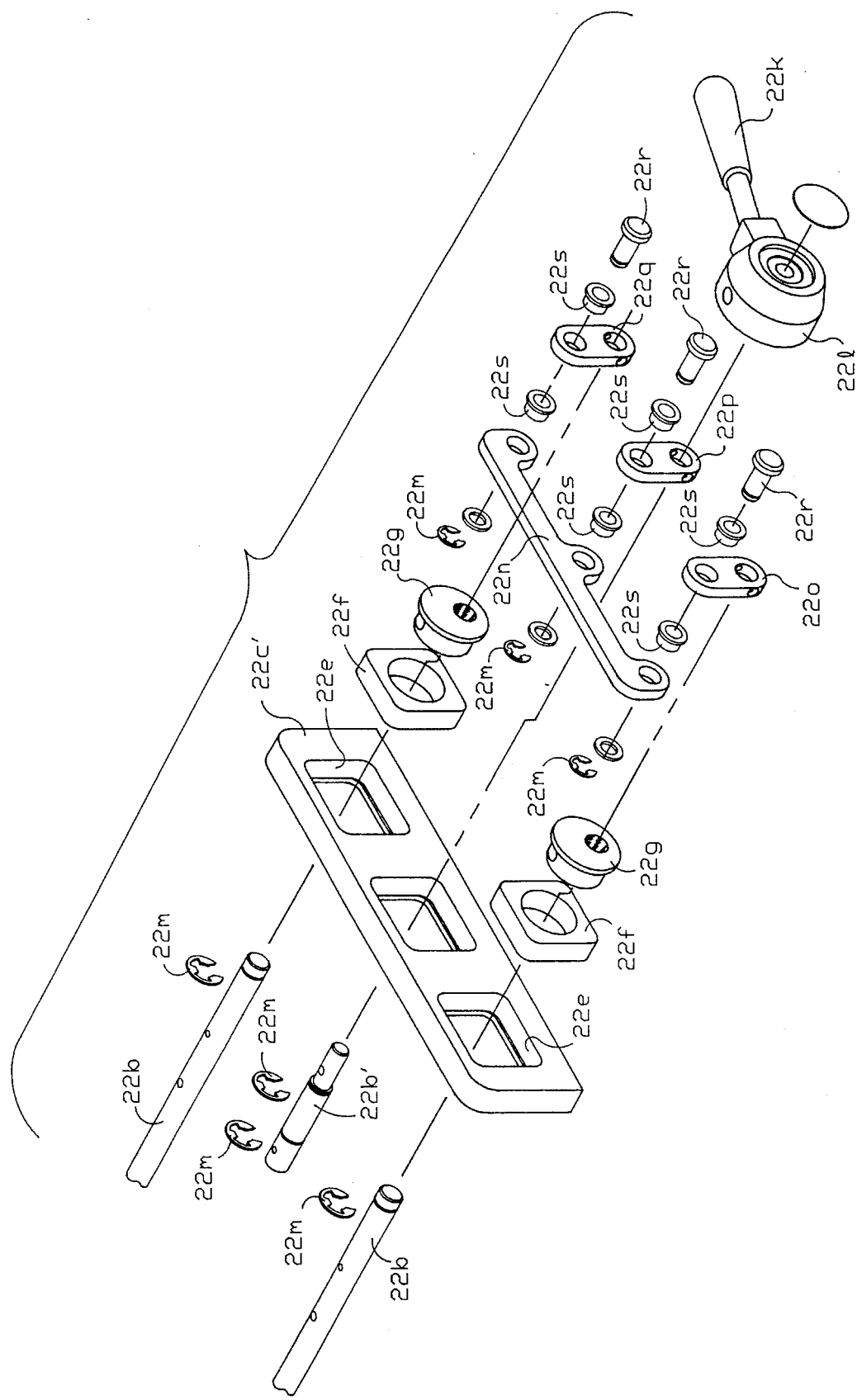
FIG. 8 is a blown-apart perspective view of components of a linking mechanism used in the FIGS. 6, 7 embodiment.

FIGS. 6 and 7 show views similar to FIGS. 2 and 3 respectively of a modified embodiment of a test fixture adapted for use with large circuit boards CB' while FIG. 8 shows various components of a linking mechanism employed in the modified embodiment. Test fixture 100 made in accordance with the modified embodiment includes a cam assembly comprising a plurality of cam mechanisms using a modified cam slide plate 22c' in which the cam mechanisms are coupled together by a link 22n through intermediate link members 22o, 22p and 22q respectively which are keyed to their respective shafts to rotate with them and rotatably coupled to link 22n through pins 22r and suitable bushings 22s. Lever handle 22k, FIG. 4a, is attached to a central shaft 22b' so that movement of lever handle 22k causes rotational movement of the central shaft and driving intermediate link 22f which movement is transferred through link 22n to outer intermediate links 22o, 22q and in turn to their respective cam shafts.

Since the remainder of the apparatus is identical with that of the FIGS. 1–5 embodiment the description will not be repeated.

Although the present invention has been illustrated and described in the environment of a mechanical test fixture, it can be used to translate rotational movement to a selected rectilinear stroke of a given surface area or of a plurality of spaced pusher pins against a selected article. It is, therefore, intended that the present invention be limited only by the scope of the appended claims.

What is claimed:

1. A circuit board test fixture comprising
   a base,
   a frame having first and second opposed end portions and first and second opposed side portions, the second end portion pivotably mounted on the base so that the frame can pivot toward the base to a closed position and away from the base to an open position, means to latch the first end portion of the frame to the base in the closed position,
   a pusher plate having a face surface lying in a plane, the pusher plate being movably mounted relative to the frame, a cam mechanism comprising a cam slide plate fixedly attached to the pusher plate, the cam slide plate having an opening therethrough forming a rectilinear track, a cam block slidably mounted in the opening and adapted to slide with rectilinear motion generally parallel with the face surface of the pusher plate, the cam block having a circular opening therethrough, and a circular cam member fixedly mounted eccentrically on a cam shaft rotatably mounted on the frame, the diameter of the cam selected to rotatably fit within the circular opening, the cam member being disposed within the circular opening,
   means to maintain a selected angular orientation of the pusher plate relative to the frame, and
   means to turn the cam shaft whereby rotation of the cam member will cause the cam block to slide in the rectilinear track and force the cam slide plate and the pusher plate to move relative to the frame in a direction generally perpendicular to the face surface to an actuated position.

2. A circuit board test fixture according to claim 1 in which the means to maintain a selected orientation comprise a plurality a plurality of elongated elements having first and second ends and being received in respective vertically disposed bores in the frame, the elements having respective longitudinal axes and being movable within the bores along the respective longitudinal axes, each element having the first end fixedly attached to the pusher plate.

3. A circuit board test fixture according to claim 2 in which a spring is coupled between the second end of each elongated element and the frame placing an upward bias on the elongated elements.

4. A circuit board test fixture according to claim 1 in which the cam mechanism comprises a plurality of cam slide plates fixedly attached to the pusher plate spaced apart and in alignment with one another, each cam slide plate having an opening forming a rectilinear track with a cam block slidably mounted in each opening, each cam block having a circular bore therethrough with a circular cam member eccentrically mounted on the cam shaft and disposed in a respective circular bore.

5. A circuit board test fixture according to claim 4 in which the cam mechanism comprises two cam slide plates.

6. A circuit board test fixture according to claim 4 in which the cam mechanism comprises three cam slide plates.

7. A circuit board test fixture according to claim 1 in which the first and second opposed end portions and the first and second opposed side portions of the frame are integrally formed.

8. A circuit board test fixture according to claim 1 in which there are a plurality of cam mechanisms, each cam mechanism having an intermediate link having first and second ends, the first end attached to its respective cam shaft and movable therewith and further including an interconnecting link, the second end of each intermediate link connected to the interconnecting link.

9. A circuit board test fixture according to claim 1 in which the means to latch the first end portion of the frame to the base includes a latch arm having a latch notch adapted to receive therein a latch pin mounted on the base, the latch arm being pivotably mounted on the first end portion between a latching position and an unlatching position.

10. A circuit board test fixture according to claim 9 further including means to lock the latch arm in the latched position when the pusher plate is in the actuated position.

11. A circuit board test fixture according to claim 10 in which the means to lock the latch arm includes an additional cam mounted on the cam shaft and an elongated member having opposite ends is mounted with one end adjacent to the additional cam member and the opposite end adjacent the latch arm, the additional cam member pushing the elongated member against the latch arm when the cam shaft is rotated to the actuated position.

12. A method of moving a pusher plate so that a circuit board placed beneath the pusher plate can be moved into a position where selected locations of the circuit board can be placed in electrical connection with an array of test pins disposed beneath the circuit board comprising the steps of;
   taking a plurality of slide plates, each having opposed side surfaces, forming an opening between the opposed side surfaces of each slide plate to form a track, attaching the slide plates to a pusher plate, the slide plates being spaced from one another with the openings in alignment with each other, placing a block in each opening, each block having a circular bore therthrough, placing a circular cam member in each circular bore, the circular cam members having a size to be closely and rotatably received in the circular bore, eccentrically mounting the cam members on a shaft and rotatably mounting the shaft on a support whereby rotation of the cam shaft will cause the cam blocks to slide within the track and at the same time translate rotational movement of the cam shaft into motion of the pusher plate toward and away from the array of test pins.

13. A method according to claim 12 further including the steps of forming a plurality of vertical bores in the support and placing an elongated member in each bore attached to the pusher plate to maintain the pusher plate in a selected angular position.

14. A method according to claim 13 further including the step of forming the support from an integral frame member so that bores for the elongated members and for the cam shaft can be precisely related to each other with optimum accuracy.

15. A circuit board test fixture comprising a base, a frame having first and second opposed end portions and first and second opposed side portions, the second end portion pivotably mounted on the base so that the frame can pivot toward the base to a closed position and away from the base to an open position, means to latch the first end portion of the frame to the base in the closed position, a pusher plate having a face surface lying in a plane the pusher plate being movably mounted relative to the frame, a cam mechanism comprising a plurality of cam slide plates fixedly attached to the pusher plate and being spaced apart and in alignment with one another, each cam slide plate having an opening therethrough forming a rectilinear track, the openings being in alignment with one another, a cam block slidably mounted in each opening and adapted to slide with rectilinear motion generally parallel with the face surface of the pusher plate, each cam block having a circular opening therethrough, a cam shaft rotatably mounted on the frame, the cam shaft having a longitudinal axis extending generally parallel with the face surface and a circular cam member for each cam block fixedly mounted eccentrically on the shaft, the diameter of the cam member selected to rotatably fit within the circular opening, the cam member being disposed within a respective circular opening, means to maintain a selected angular orientation of the pusher plate relative to the frame, and means to turn the cam shaft whereby rotation of the cam members will cause the cam blocks to slide in the rectilinear track and force the cam slide plates and the pusher plate to move relative to the frame in a direction generally perpendicular to the face surface to an actuated position.

16. A circuit board test fixture according to claim 2 in which the frame has a stop surface lying in a plane and further including means cooperating with the stop surface to limit motion of each elongated element to ensure that the face surface of the pusher plate lies in a plane parallel to the plane in which the stop surface lies.

17. A circuit board test fixture according to claim 16 further including a spring coupled between the second end of each elongated element and the frame placing an upward bias on the elongated element and the means to limit motion of each elongated element comprises a spring retainer cap received on the second end of each elongated element, the spring retainer cap having a surface engageable with the stop surface of the frame.

* * * * *